United States Patent
Valls Gadea et al.

(10) Patent No.: US 11,167,646 B2
(45) Date of Patent: Nov. 9, 2021

(54) INPUT FAULT DETECTION SYSTEM

(71) Applicant: LEAR CORPORATION, Southfield, MI (US)

(72) Inventors: Antoni Valls Gadea, Valls (ES); Sergio Alquezar, Valls (ES)

(73) Assignee: Lear Corporation, Southfield, MI (US)

(*) Notice: Subject to any disclaimer, the term of this patent is extended or adjusted under 35 U.S.C. 154(b) by 50 days.

(21) Appl. No.: 16/539,244

(22) Filed: Aug. 13, 2019

(65) Prior Publication Data

US 2020/0070662 A1    Mar. 5, 2020

Related U.S. Application Data

(60) Provisional application No. 62/726,495, filed on Sep. 4, 2018.

(51) Int. Cl.
*B60L 3/12*    (2006.01)
*G01R 31/317*   (2006.01)
*G01R 31/40*    (2020.01)

(52) U.S. Cl.
CPC .......... *B60L 3/12* (2013.01); *G01R 31/31703* (2013.01); *G01R 31/40* (2013.01)

(58) Field of Classification Search
CPC ..... B60L 3/12; G01R 31/31703; G01R 31/40; G01R 31/006; G01R 31/66; G01R 31/52; G05B 23/0213; G05B 2219/24065
See application file for complete search history.

(56) References Cited

U.S. PATENT DOCUMENTS

| | | | |
|---|---|---|---|
| 5,729,167 A * | 3/1998 | Kujawa | H01H 1/605 327/137 |
| 9,608,428 B2 | 3/2017 | Petruzzi et al. | |
| 9,851,387 B2 | 12/2017 | Aceña et al. | |
| 9,871,508 B2 | 1/2018 | Xiao et al. | |
| 9,935,452 B2 | 4/2018 | Looby et al. | |
| 2007/0217101 A1* | 9/2007 | Carter | H04M 19/08 361/54 |
| 2011/0264834 A1* | 10/2011 | Fletcher | H03K 19/017581 710/104 |
| 2017/0170655 A1 | 6/2017 | Nguyen et al. | |

FOREIGN PATENT DOCUMENTS

WO    03079031 A1    9/2003

* cited by examiner

*Primary Examiner* — Akm Zakaria
(74) *Attorney, Agent, or Firm* — Brooks Kushman P.C.

(57) ABSTRACT

A vehicle system is provided with an input pin, an interface unit and a microcontroller. The input pin connects to an external power source or ground through an external switch. The interface unit is adapted to connect to the input pin in a test configuration, and in a normal configuration for providing a wetting current to the external switch, and in a test configuration. The microcontroller is programed to: configure the interface unit in the normal configuration in response to input pin characteristics, reconfigure the interface unit in the test configuration, measure a test voltage of the interface unit, and generate output indicative of a status of the external switch based on a comparison of the test voltage to a reference voltage.

20 Claims, 5 Drawing Sheets

INPUT FAULT DETECTION SYSTEM

CROSS-REFERENCE TO RELATED APPLICATIONS

This application claims the benefit of U.S. provisional application Ser. No. 62/726,495 filed Sep. 4, 2018, the disclosure of which is hereby incorporated in its entirety by reference herein.

TECHNICAL FIELD

One or more embodiments relate to a vehicle system for evaluating controller inputs.

BACKGROUND

Vehicles include electronic control units or modules that are responsible for monitoring and controlling one or more electrical systems or subsystems. Conventional automobiles may include numerous control units, such as an engine control module (ECM), a powertrain control module (PCM), and a body control module (BCM). Automobiles may include systems for monitoring such control units and corresponding circuits for electrical faults.

SUMMARY

In one embodiment, a control module is provided with a housing, an interface unit and a microcontroller. The housing includes an input pin for connecting to an external power source or ground through an external switch. The interface unit is supported by the housing and adapted to connect to the input pin in a normal configuration for providing a wetting current to the external switch. The interface unit is also adapted to connect to the input pin in a test configuration. The microcontroller is supported by the housing and programed to: configure the interface unit in the normal configuration in response to input pin characteristics, measure a normal voltage of the interface unit, reconfigure the interface unit in the test configuration, measure a test voltage of the interface unit, and generate output indicative of a status of the external switch based on a comparison of both the normal voltage and the test voltage to a reference voltage.

In another embodiment, a vehicle system is provided with an input pin, an interface unit and a microcontroller. The input pin connects to an external power source or ground through an external switch. The interface unit is adapted to connect to the input pin in a test configuration, and in a normal configuration for providing a wetting current to the external switch. The microcontroller is programed to: configure the interface unit in the normal configuration in response to input pin characteristics, reconfigure the interface unit in the test configuration, measure a test voltage of the interface unit, and generate output indicative of a status of the external switch based on a comparison of the test voltage to a reference voltage.

In yet another embodiment, a method of evaluating controller inputs is provided. A control module with an input pin for connecting to an external power source or ground through an external switch is provided, along with an interface unit adapted to provide a wetting current to the external switch. The interface unit is controlled to bias current flow through the external switch along a first path in response to information indicative of input pin characteristics during a normal condition. A normal voltage of the interface unit is measured during the normal condition. The interface unit is controlled to bias current flow through the external switch along a second path during a test condition. A test voltage of the interface unit is measured during the test condition. Output indicative of a short circuit fault is generated based on a comparison of the normal voltage and the test voltage to a reference voltage.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
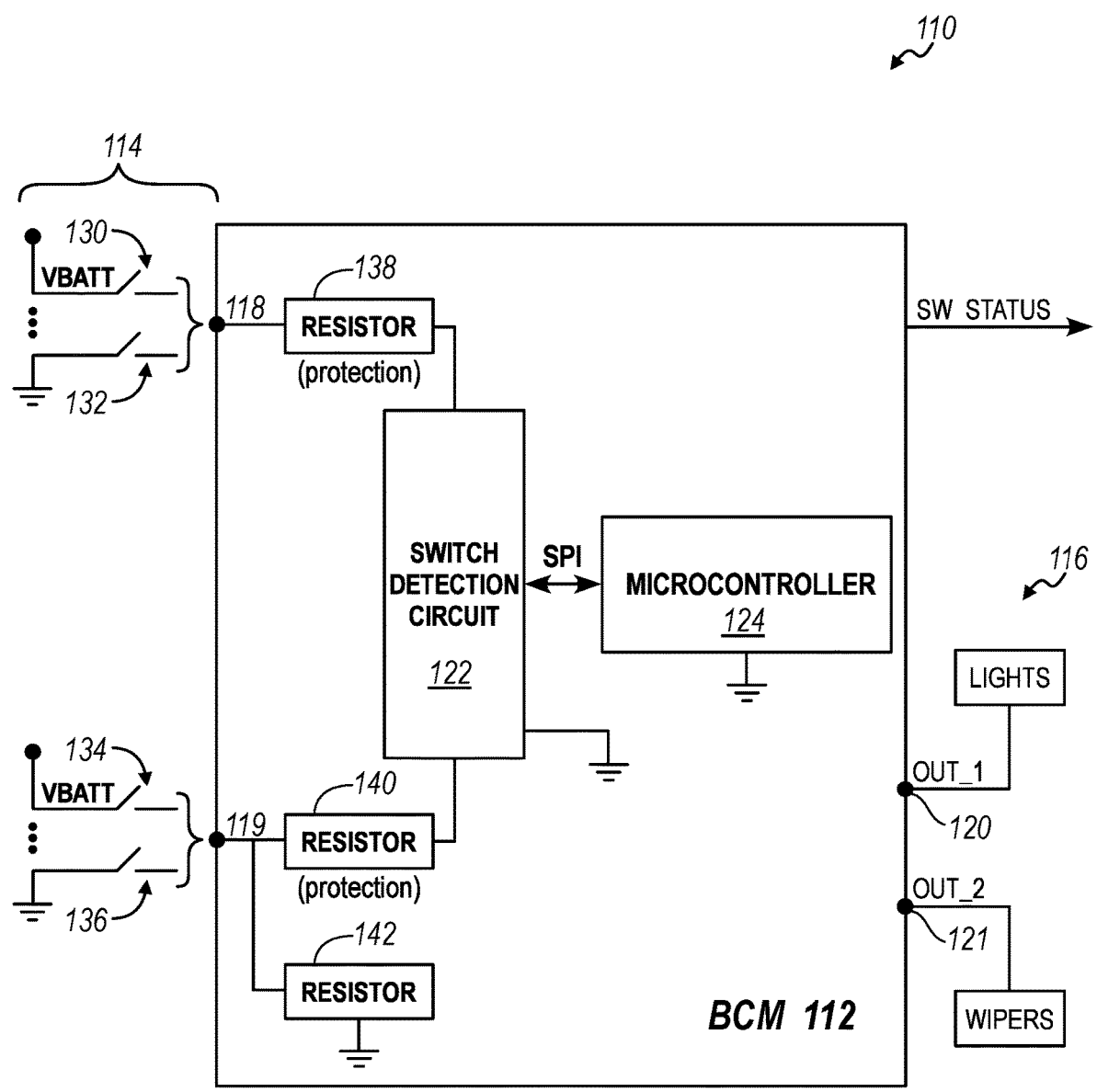
FIG. 1 is a schematic block diagram illustrating a vehicle system for evaluating the performance of controller inputs according to one or more embodiments.

With reference to FIG. 1, a vehicle system for evaluating the performance of controller inputs is illustrated in accordance with one or more embodiments and generally referenced by numeral 110. The vehicle system 110 is depicted integrated within a vehicle electronic control unit 112, such as a body control module (BCM). The BCM 112 is connected to numerous inputs 114 and numerous electronic accessories 116, such as head lights, windshield wipers, door locks, power windows, air conditioning, etc. The inputs 114 include input circuits and analog and digital inputs that provide control signals for controlling the accessories 116. The BCM 112 includes a housing that supports first and second input pins 118, 119; and first and second output pins 120, 121 for connecting to the accessories 116.

Although two input pins 118, 119 are illustrated in FIG. 1, the BCM 112 may include over 80 different input pins. As vehicles become more sophisticated, the number of input pins increases. The vehicle system 110, which is integrated within the BCM 112, evaluates the input pins and corresponding input circuits to detect faults, e.g., short circuits or open circuits, without requiring additional monitoring systems.

The vehicle system 110 includes a switch detection circuit 122 and a microcontroller 124. The switch detection circuit 122 is a multi-switch detection integrated circuit (MSDI) with a plurality of interface stages according to one or more embodiments. In one embodiment, the switch detection circuit 122 is a MC33978 chip by Freescale Semiconductor. The input pins 118, 119 may each have different types or characteristics, e.g., normally open, normally closed, switched to positive, switched to ground, etc. The microcontroller 124 receives the input type information and configures each interface stage using digital communication to accommodate the input pin type to provide the appropriate configuration. Such digital configuration allows the use of common components for different applications. The microcontroller 124 controls the switch detection circuit 122 to switch between the selected pin type, or normal operating condition configuration and a test configuration while monitoring the output voltage of the interface unit according to an evaluation method, such as that described with reference to FIGS. 3A-10, to diagnose controller input faults.

Each input pin 118, 119 connects to an external power source or ground by an input circuit that includes one or more external switches. The external power source is a vehicle battery ($V_{BATT}$), according to one or more embodiments. In one embodiment, $V_{BATT}$ is a 24-volt DC battery. In other embodiments, $V_{BATT}$ is a 12-volt DC battery. The illustrated embodiment of the vehicle system 110 includes: a first external switch 130 for connecting the first input pin 118 to $V_{BATT}$, i.e., switch to positive; and a second external switch 132 for connecting the first input pin 118 to ground, i.e., switch to ground. The vehicle system 110 also includes: a third external switch 134 for connecting the second input pin 119 to $V_{BATT}$, i.e., switch to positive; and a fourth external switch 136 for connecting the second input pin 119 to ground, i.e., switch to ground. The vehicle system 110 also includes one or more resistors (e.g., protection resistors 138 and 140, and pull-down resistor 142) connected between the input pins 118, 119 and the switch detection circuit 122.

The microcontroller 124 generally includes any number of microprocessors, ASICs, ICs, memory (e.g., FLASH, ROM, RAM, EPROM and/or EEPROM) and software code to co-act with one another to perform a series of operations. The microcontroller 124 includes predetermined data, or "look up tables" that are stored within the memory, according to one or more embodiments. The microcontroller 124 and the switch detection circuit 122 communicate using a serial peripheral interface (SPI) over a four-wire serial bus, according to one embodiment. An (SPI) is a synchronous serial communication interface specification used for short distance communication, primarily in embedded systems.

Figure 2:
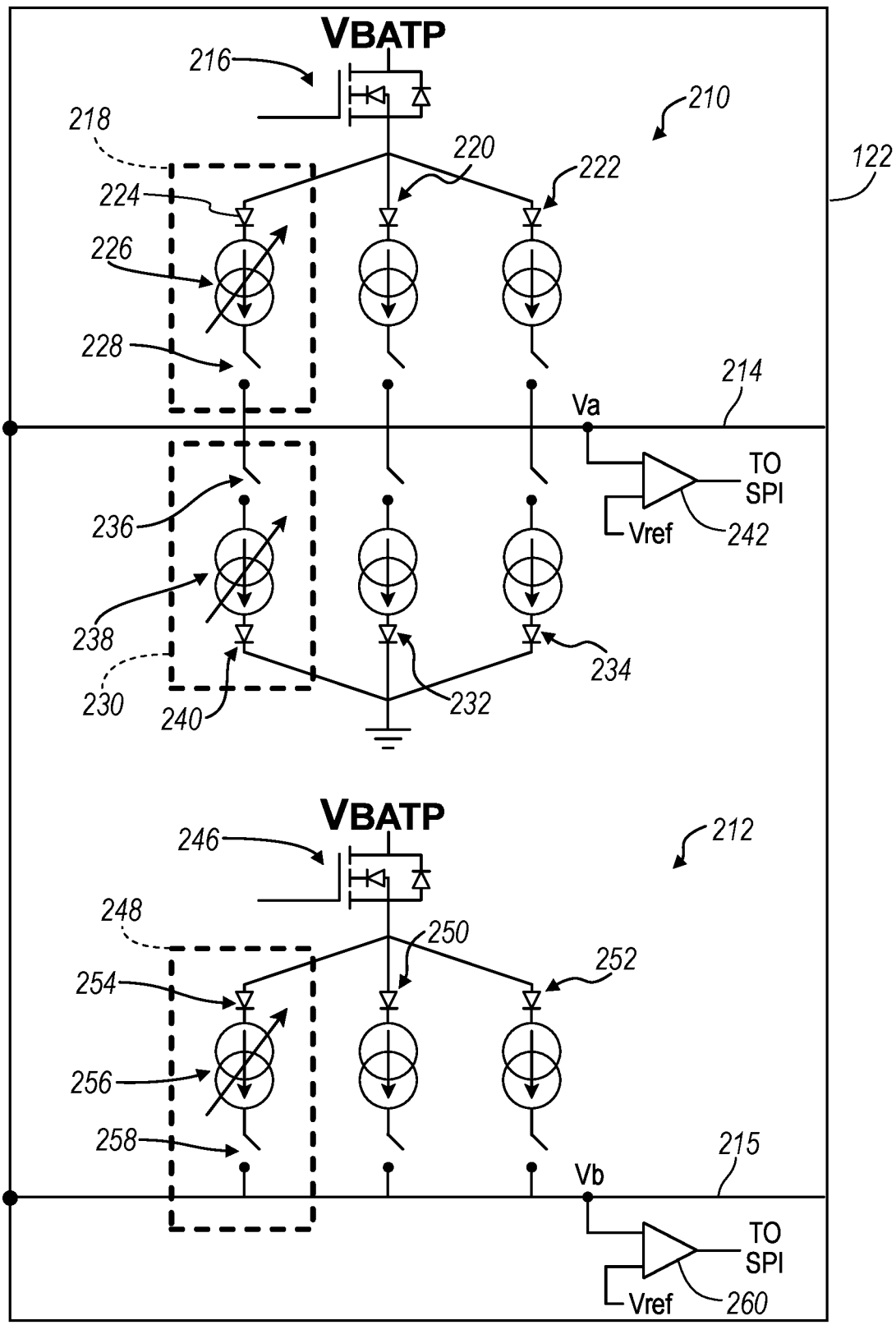
FIG. 2 is a circuit diagram illustrating a first interface unit and a second interface unit of the vehicle system of FIG. 1.

Referring to FIG. 2, the switch detection circuit 122 includes a first interface unit 210 and a second interface unit 212. The microcontroller 124 configures each interface unit 210, 212 depending on the external input type, e.g., switch to positive ($V_{BATT}$) or switch to ground (GND), to provide the appropriate wetting current and to detect the switch status. Wetting current refers to the minimum electric current needed to flow through a contact to break through any surface film resistance.

The first interface unit 210 is connected to an internal power source ($V_{BATP}$) by a pre-regulator 216 to provide a stable supply voltage of 8-12 Volts. In one embodiment $V_{BATP}$ is less than $V_{BATT}$, e.g., $V_{BATP}$ is a 12-volt source and $V_{BATT}$ is a 24-volt source. The first interface unit 210 includes the pre-regulator 216, and three current source strings that are arranged in a "pull-up" configuration: a first current source string 218, a second current source string 220, and a third current source string 222. Each current source string 218, 220, and 222 includes a pull-up current source, and is arranged in parallel with each other between the pre-regulator 216 and a first output line 214. Each current source is designed to provide a different wetting current to the external switch 130, 132, and the microcontroller 124 selects one current source string for the input pin 118 based on the application requirements as part of the configuration process.

The first pull-up current source string 218 includes a diode 224, a variable current source 226, and a switch 228. The variable current source 226 provides a wetting current between 6-20 mA as required by the external switch 130, 132, according to one or more embodiments. The diode 224 and the switch 228 are used to control current flow in one direction through the current source 226, i.e., from the pre-regulator 216 to the first output line. The microcontroller 124 activates or enables the current source string 218 by closing its switch 228.

The first interface unit 210 includes three additional current source strings that are each arranged in a "pull-down" configuration: a fourth current source string 230; a fifth current source string 232; and a sixth current source string 234. Each current source string 230, 232, and 234 includes a pull-down current source, and is arranged in parallel with each other between the first output line 214 and ground. The fourth current source string 230 includes: a switch 236; a variable current source 238, e.g., between 6-20 mA; and a diode 240. The fourth current source string 230 is used to configure the first and second external switches 130, 132 by supplying current to/from the first input pin 118. The microcontroller 124 activates or enables the current source string 230 by closing its switch 236.

The vehicle system 110 monitors a voltage signal (Va) along the first output line 214 according to one or more embodiments. The first interface unit 210 includes a comparator 242, that compares Va to a reference voltage (Vref) and provides a corresponding comparison signal that is indicative of the status of the external switch 130 or 132, to the microcontroller 124 over the SPI bus.

The second interface unit 212 is also connected to $V_{BATP}$, and includes a pre-regulator 246, and three current source strings that are arranged in a pull-up configuration: a first current source sting 248, a second current source string 250, and a third current source string 252. Each current source string 248, 250, 252, includes a pull-up current source, and is arranged in parallel with each other between the pre-regulator 246 and a second output line 215. The first pull-up current source string 248 includes a diode 254, a variable current source 256, and a switch 258; and is configured to provide the wetting current to the third and fourth external switches 134, 136.

The vehicle system 110 monitors a voltage signal (Vb) along the second output line 215 according to one or more embodiments. The second interface unit 212 includes a comparator 260, that compares Vb to a reference voltage (Vref) and provides a corresponding comparison signal that is indicative of the status of the external switch 134 or 136 to the microcontroller 124 over the SPI bus.

Referring to FIGS. 1-8, the vehicle system 110 performs a series of tests to evaluate the input pins 118, 119 and corresponding external switches 130, 132, 134, 136 of the input circuits 114 of the BCM 112. These tests may be performed periodically during vehicle operation, e.g., every 50 ms.

Figure 3A:
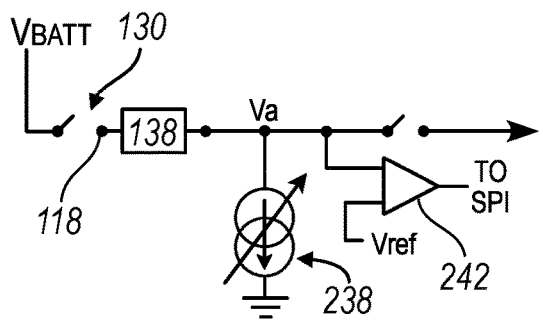
FIG. 3A is a schematic diagram of the first interface unit of FIG. 2, illustrated in a normal operating condition configuration and connected to an input pin that is switched positive.

FIGS. 3A-5 illustrate the vehicle system 110 evaluating the first and second external switches 130, 132 and the first input pin 118 of the BCM 112 that are connected to the first interface unit 210. FIGS. 3A and 4A illustrate normal operating configurations; and FIGS. 3B and 4B illustrate test configurations.

FIG. 3A illustrates the first interface unit 210 in a normal operating condition configuration and connected to an input pin 118 that is switched positive. The first interface unit 210 is illustrated with an activated pull-down current source 238, i.e., the internal switch 236 (FIG. 2) is closed. The input pin 118 connects to $V_{BATT}$ through the first external switch 130. The pull-down current source 238 provides the wetting current to the first external switch 130 by biasing current flow from $V_{BATT}$ toward input pin 118.

Figure 3B:
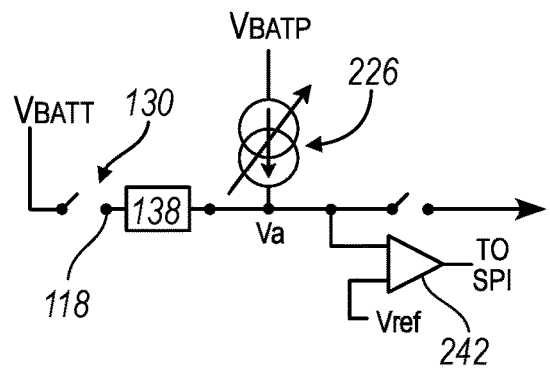
FIG. 3B is a schematic diagram of the first interface unit of FIG. 3A, illustrated in a test configuration.

FIG. 3B illustrates the first interface unit 210 in a test configuration and connected to an input pin 118 that is switched positive. The first interface unit 210 is illustrated with an activated pull-up current source 226, i.e., the internal switch 228 (FIG. 2) is closed. The input pin 118 connects to $V_{BATT}$ through the first external switch 130. The pull-up current source 226 allows the vehicle system 110 to distinguish between a closed switch condition and a short-circuit to ground condition.

Figure 4A:
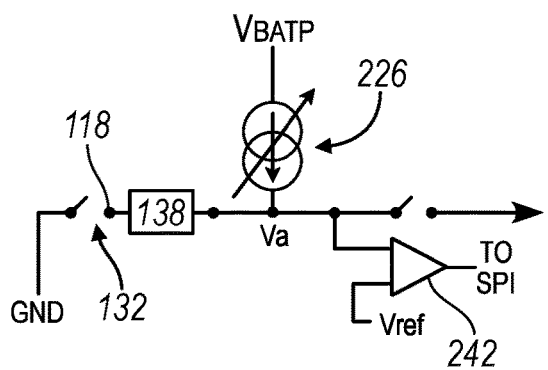
FIG. 4A is a schematic diagram of the first interface unit of FIG. 2, illustrated in a normal operating condition configuration and connected to an input pin that is switched to ground.

FIG. 4A illustrates the first interface unit 210 in a normal operating condition configuration and connected to an input pin 118 that is switched to ground. The first interface unit 210 is illustrated with an activated pull-up current source 226, i.e., the internal switch 228 (FIG. 2) is closed. The input pin 118 connects to GND through the second external switch 132. The pull-up current source 226 provides the wetting current to the second external switch 132 by biasing current flow toward GND through the first input pin 118.

Figure 4B:
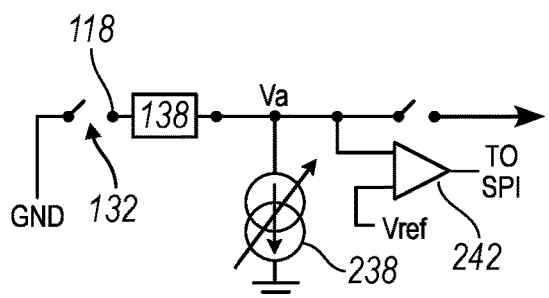
FIG. 4B is a schematic diagram of the first interface unit of FIG. 4A, illustrated in a test configuration.

FIG. 4B illustrates the first interface unit 210 in a test configuration and connected to an input pin 118 that is switched to ground. The first interface unit 210 is illustrated with an activated pull-down current source 238, i.e., the internal switch 236 (FIG. 2) is closed. The input pin 118 connects to GND through the second external switch 132. The pull-down current source 238 provides the wetting current to the second external switch 132 by biasing current flow from GND toward input pin 118.

Figure 5:
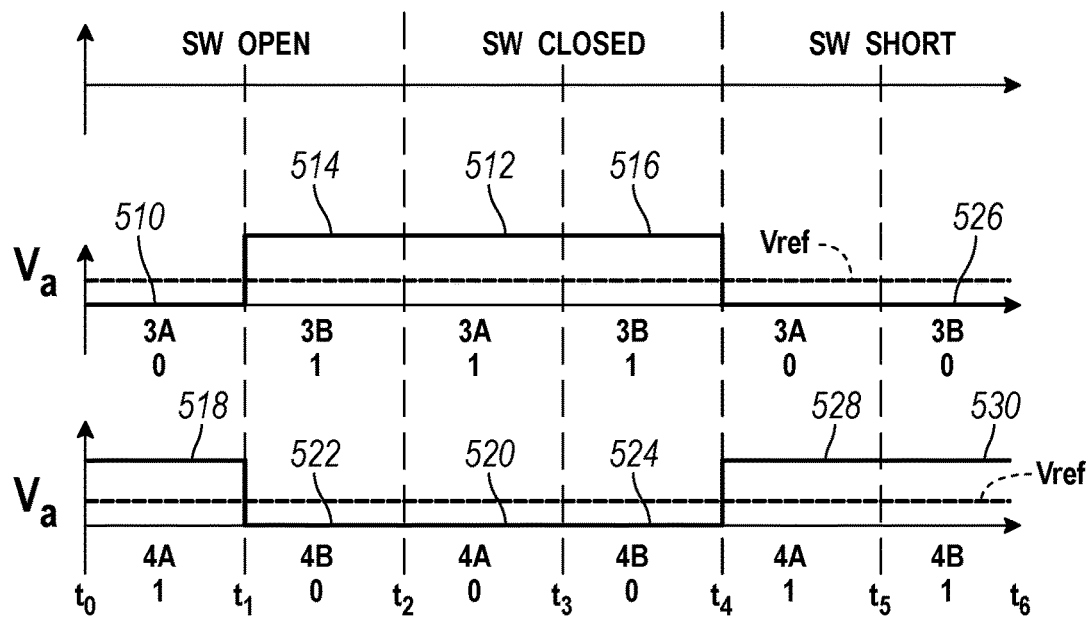
FIG. 5 is a graph of electrical characteristics measured at the output of the first interface unit of FIG. 2 corresponding to the configurations shown in FIGS. 3A-4B.

FIG. 5 illustrates the voltage output of the first interface unit 210 as measured at Va on the first output line 214 as described with reference to FIGS. 3A-4B. The time period from $t_0$ to $t_2$ illustrates conditions when the first and second external switch 130, 132 are open. At time $t_0$, the first interface unit 210 is set to its normal operating condition configuration (FIGS. 3A, 4A); then at time $t_1$ the first interface unit 210 is switched to its test configuration (FIGS. 3B, 4B). The time period from $t_2$ to $t_4$ illustrates conditions when the external switch 130, 132 is closed. At time $t_2$, the first interface unit 210 is set to its normal operating configuration (FIGS. 3A, 4A); then at time $t_3$ the first interface unit 210 is switched to its test configuration (FIGS. 3B, 4B).

With reference to FIGS. 3A and 5, when the first interface unit 210 is configured in its normal configuration with the first external switch 130 open, the voltage signal (Va) is lower than Vref, as referenced by numeral 510. When the first external switch 130 is closed, $V_{BATT}$ supplies current through the first input pin 118, and Va is greater than Vref, as referenced by numeral 512.

With reference to FIGS. 3B and 5, when the first interface unit 210 is configured in its test configuration with the first external switch 130 open, Va is greater than Vref, as referenced by numeral 514. When the first external switch 130 is closed, $V_{BATT}$ supplies additional current through input pin 118, and Va remains high, i.e., greater than Vref, as referenced by numeral 516.

With reference to FIGS. 4A and 5, when the first interface unit 210 is configured in its normal configuration with the second external switch 132 open, the voltage signal (Va) is greater than Vref, as referenced by numeral 518. When the second external switch 132 is closed, the current is biased toward the switch 132 to ground, and Va is less than Vref, as referenced by numeral 520.

With reference to FIGS. 4B and 5, when the first interface unit 210 is configured in its test configuration with the second external switch 132 open, Va is less than Vref, as referenced by numeral 522. When the second external switch 132 is closed, the current flows to ground and Va is less than Vref, as referenced by numeral 524.

FIG. 5 also illustrates the voltage signal Va during switch fault conditions. The time period from $t_4$ to $t_6$ illustrates fault conditions when the first and second external switches 130, 132 are shorted to ground or $V_{BATT}$. At time $t_4$, the interface unit 210 is set to its normal operating configuration (FIGS. 3A, 4A); then at time $t_5$ the interface unit is switched to its test configuration (FIGS. 3B, 4B). When the first external switch 130 is shorted to ground, Va remains less than Vref, as referenced by numeral 526. When the second external switch 132 is shorted to $V_{BATT}$, Va is greater than Vref when the first interface unit 210 is configured in the normal configuration (FIG. 4A), as referenced by numeral 528; and also when the first interface unit 210 is configurated in the test configuration (FIG. 4B), as referenced by numeral 530.

Figure 6A:
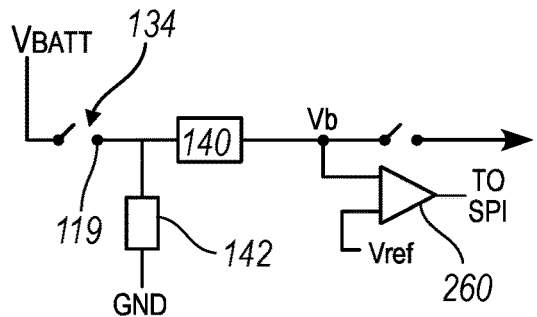
FIG. 6A is a schematic diagram of the second interface unit of FIG. 2, illustrated in a normal operating condition configuration and connected to an input pin that is switched positive.

FIGS. 6A-8 illustrate the vehicle system 110 evaluating the third and fourth external switches 134, 136 and the second input pin 119 of the BCM 112 that are connected to the second interface unit 212. FIGS. 6A and 7A illustrate normal operating configurations; and FIGS. 6B and 7B illustrate test configurations.

FIG. 6A illustrates the second interface unit 212 in a normal operating condition configuration and connected to an input pin 119 that is switched positive. The second interface unit 212 is illustrated in an open circuit configuration with the pull-down resistor 142 connected between the protection resistor 140 and ground that provides the wetting current needed for the third external switch 134 (switch to $V_{BATT}$). The input pin 119 connects to $V_{BATT}$ through the third external switch 134.

Figure 6B:
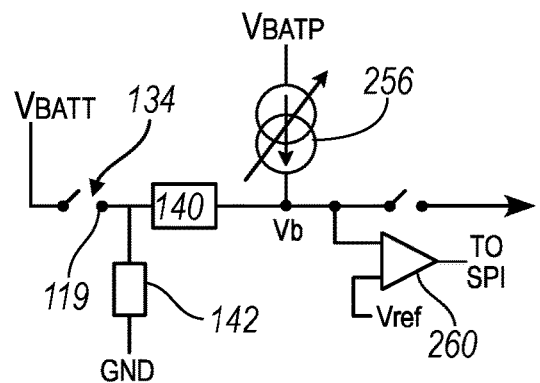
FIG. 6B is a schematic diagram of the second interface unit of FIG. 6A, illustrated in a test configuration.

FIG. 6B illustrates the second interface unit 212 in a test configuration and connected to an input pin 119 that is switched positive. The second interface unit 212 is illustrated with an activated pull-up current source 256, i.e., the internal switch 258 (FIG. 2) is closed. The input pin 119 connects to $V_{BATT}$ through the third external switch 134.

Figure 7A:
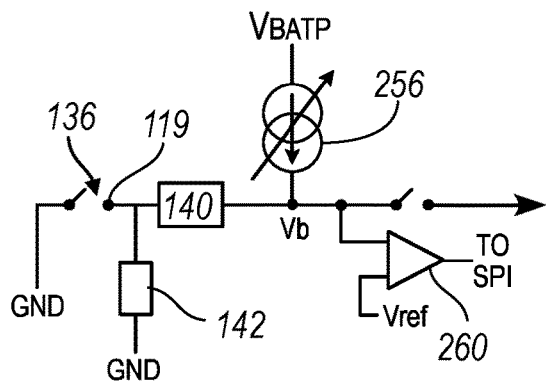
FIG. 7A is a schematic diagram of the second interface unit of FIG. 2, illustrated in a normal operating condition configuration and connected to an input pin that is switched to ground.

FIG. 7A illustrates the second interface unit 212 in a normal operating condition configuration and connected to an input pin 119 that is switched to ground. The second interface unit 212 is illustrated with an activated pull-up current source 256, i.e., the internal switch 258 (FIG. 2) is closed. The input pin 119 connects to GND through the fourth external switch 136. The pull-up current source 256 provides the wetting current to the fourth external switch 136 by biasing current flow toward $V_{BATT}$ from input pin 119.

Figure 7B:
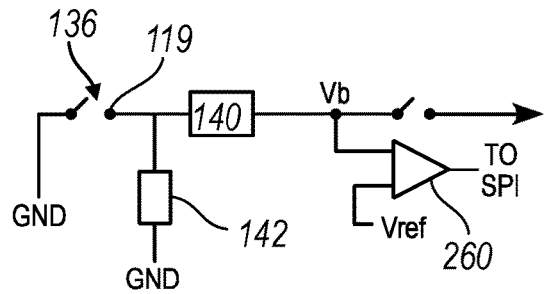
FIG. 7B is a schematic diagram of the second interface unit of FIG. 7A, illustrated in a test configuration.

FIG. 7B illustrates the second interface unit 212 in a test configuration and connected to an input pin 119 that is switched to ground. The second interface unit 212 is illustrated in an open circuit configuration with the pull-down resistor 142 connected between the protection resistor 140 and ground. The input pin 119 connects to GND through the fourth external switch 136.

Figure 8:
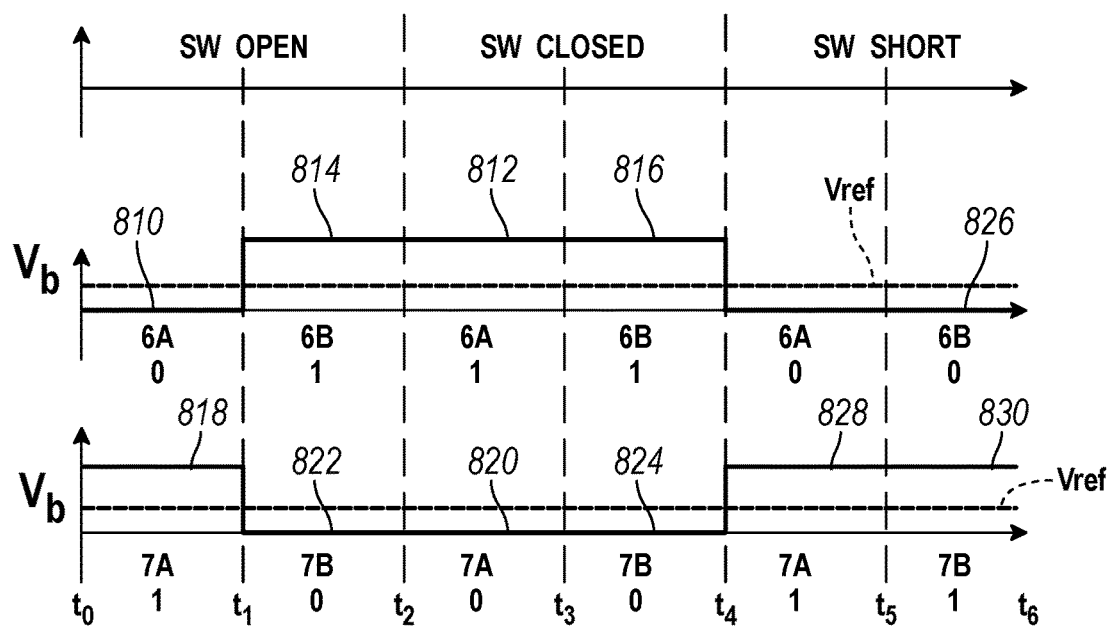
FIG. 8 is a graph of electrical characteristics measured at the output of the second interface unit of FIG. 2 corresponding to the configurations shown in FIGS. 6A-7B.

FIG. 8 illustrates the voltage output of the second interface unit 212 as measured at Vb on the second output line 215 as described with reference to FIGS. 6A-7B. The time period from $t_0$ to $t_2$ illustrates conditions when the third and fourth external switches 134, 136 are open. At time $t_0$, the second interface unit 212 is set to its normal operating condition configuration (FIGS. 6A, 7A); then at time $t_1$ the second interface unit 212 is switched to its test configuration (FIGS. 6B, 7B). The time period from $t_2$ to $t_4$ illustrates conditions when the external switch 134, 136 is closed. At time $t_2$, the second interface unit 212 is set to its normal operating configuration (FIGS. 6A, 7A); then at time $t_3$ the second interface unit 212 is switched to its test configuration (FIGS. 6B, 7B).

With reference to FIGS. 6A and 8, when the second interface unit 212 is configured in its normal configuration with the third external switch 134 open, i.e. an open circuit configuration, the voltage signal (Vb) is less than Vref, as referenced by numeral 810, because of the open circuit. When the third external switch 134 is closed, $V_{BATT}$ supplies current through the second input pin 119, and Vb is greater than Vref, as referenced by numeral 812.

With reference to FIGS. 6B and 8, when the second interface unit 212 is configured in its test configuration with the third external switch 134 open, Vb is greater than Vref, as referenced by numeral 814. When the third external switch 134 is closed, $V_{BATT}$ supplies additional current through the second input pin 119, and Vb remains greater than Vref, as referenced by numeral 816.

With reference to FIGS. 7A and 8, when the second interface unit 212 is configured in its normal configuration with the fourth external switch 136 open, the voltage signal (Vb) is greater than Vref, as referenced by numeral 818. When the fourth external switch 136 is closed, the current is biased toward the switch 136 to ground, and Vb is less than Vref, as referenced by numeral 820.

With reference to FIGS. 7B and 8, when the second interface unit 212 is configured in its test configuration with the fourth external switch 136 open, Vb is less than Vref, as referenced by numeral 822. When the fourth external switch 136 is closed, the current flows to ground and Vb is less than Vref, as referenced by numeral 824.

FIG. 8 also illustrates the voltage signal Vb during switch fault conditions. The time period from $t_4$ to $t_6$ illustrates fault conditions when the third and fourth external switches 134, 136 are shorted to ground or $V_{BATT}$. At time $t_4$, the second interface unit 212 is set to its normal operating configuration (FIGS. 6A, 7A); then at time $t_5$ the interface unit is switched to its test configuration (FIGS. 6B, 7B). When the third external switch 134 is shorted to ground, Vb remains less than Vref, as referenced by numeral 826. When the fourth external switch 136 is shorted to $V_{BATT}$, Vb is greater than Vref when the second interface unit 212 is configured in the normal configuration (FIG. 7A), as referenced by numeral 828; and also when the second interface unit 212 is configurated in the test configuration (FIG. 7B), as referenced by numeral 830.

Figure 9:
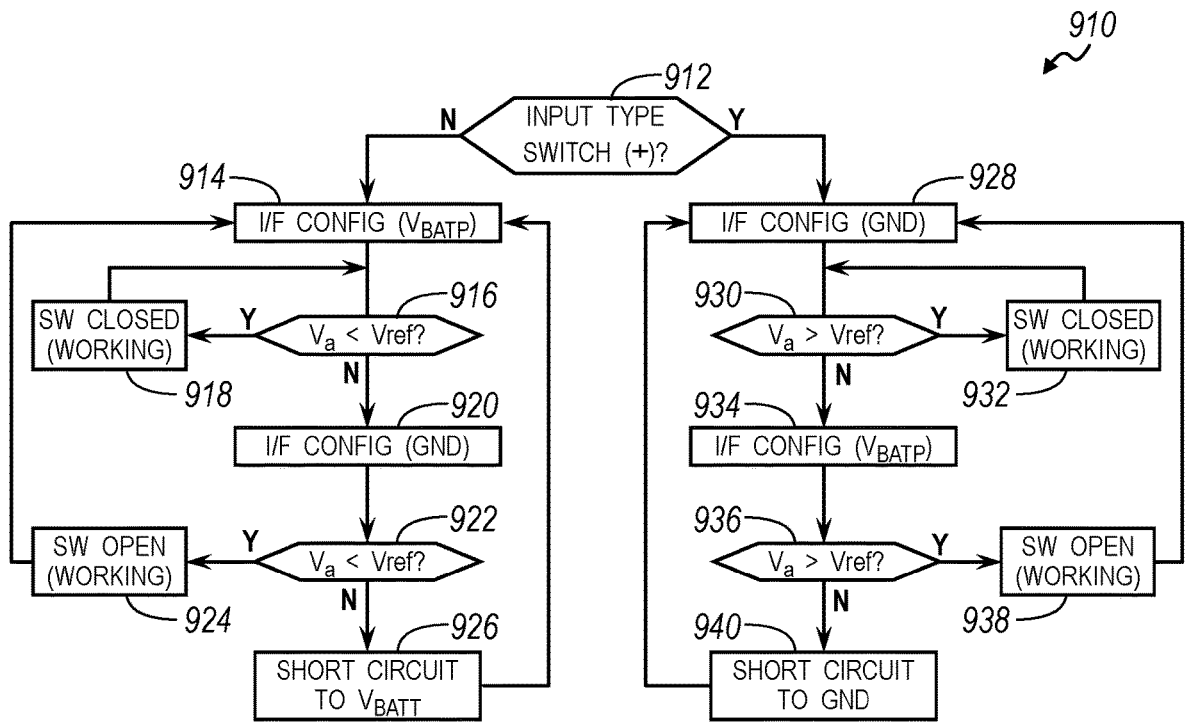
FIG. 9 is a flow chart illustrating a method for evaluating the performance of controller inputs connected to the first interface unit according to one or more embodiments.

With reference to FIG. 9, and referring back to FIGS. 3A-5, a method for evaluating the performance of controller inputs that are connected to the first interface unit 210 is illustrated according to one or more embodiments and generally referenced by numeral 910. The method 910 is implemented using software code contained with the microcontroller 124 according to one or more embodiments. In other embodiments, the method 910 is implemented in other vehicle controllers, or distributed among multiple vehicle controllers.

In operation 912, the microcontroller 124 evaluates the input pin type to determine if it is switched positive. If not, i.e., the input pin type is switched to ground, then the microcontroller 124 proceeds to operation 914 and sets the normal operating condition of the interface unit to a pull-up configuration, such as that shown in FIG. 4A. Next at operation 916 the switch detection circuit 122 evaluates the voltage signal by comparing Va to a reference voltage (Vref), e.g., using comparator 242. If Va is less than Vref (e.g., as shown by Va at 520 in FIG. 5 between $t_2$ and $t_3$), then the microcontroller 124 proceeds to operation 918 and determines that the external switch is closed, and the input circuit is working properly (i.e., there is no fault present), and then returns to operation 916. If the determination at operation 916 is negative, the microcontroller 124 proceeds to operation 920.

At operation 920, the microcontroller 124 sets the first interface unit 210 to its alternate test configuration (FIG. 4B) and activates the pull-down current source 238. Next at operation 922 the microcontroller 124 evaluates the voltage signal by comparing Va to a reference voltage (Vref), e.g., using the comparator 242. If Va is less than Vref (e.g., as shown by Va at 522 in FIG. 5 between $t_1$ and $t_2$), then the microcontroller 124 determines that the external switch is open at operation 924 and that the input circuit is working properly (i.e., there is no fault present). Then the microcontroller 124 returns to operation 914.

If the determination at operation 922 is negative, i.e., Va is greater than Vref, e.g. as shown by Va at 530 in FIG. 5 between $t_5$ and $t_6$, the microcontroller 124 determines that the second external switch 132 is shorted to $V_{BATT}$ at operation 926 and provides a switch status signal that indicates the fault. After operation 926, the microcontroller 124 returns to operation 914.

If, at operation 912, the microcontroller 124 determines that the input type is switched to positive, it proceeds to operation 928. At operation 928 the microcontroller 124 sets the normal operating condition of the interface unit to a pull-down to ground configuration, such as that shown in FIG. 3A. Next at operation 930 the switch detection circuit 122 compares the voltage signal Va to a reference voltage (Vref), e.g., using the comparator 242. If Va is greater than Vref (e.g., as shown by Va at 512 in FIG. 5 between $t_2$ and $t_3$), then the microcontroller 124 proceeds to operation 932 and determines that the first external switch 130 is closed, and the input circuit is working properly (i.e., there is no fault present), and then returns to operation 930. If the determination at operation 930 is negative, the microcontroller 124 proceeds to operation 934.

At operation 934, the microcontroller 124 sets the interface unit to its alternate test configuration, (FIG. 3B) and activates the pull-up current source 226. Next at operation 936 the switch detection circuit 122 compares the voltage signal Va to a reference voltage (Vref), e.g., using the comparator 242. If Va is greater than Vref (e.g., as shown by Va at 514 in FIG. 5 between $t_1$ and $t_2$), then the microcontroller 124 determines that the first external switch 130 is open at operation 938 and that the input circuit is working properly (i.e., there is no fault present). Then the microcontroller 124 returns to operation 928.

If the determination at operation 936 is negative, i.e., Va is less than Vref, e.g. as shown by Va at 526 in FIG. 5 between $t_5$ and $t_6$, the microcontroller 124 determines that the first external switch 130 is shorted to ground at operation 940 and provides a switch status signal that indicates the fault. After operation 940, the microcontroller 124 returns to operation 928.

Figure 10:
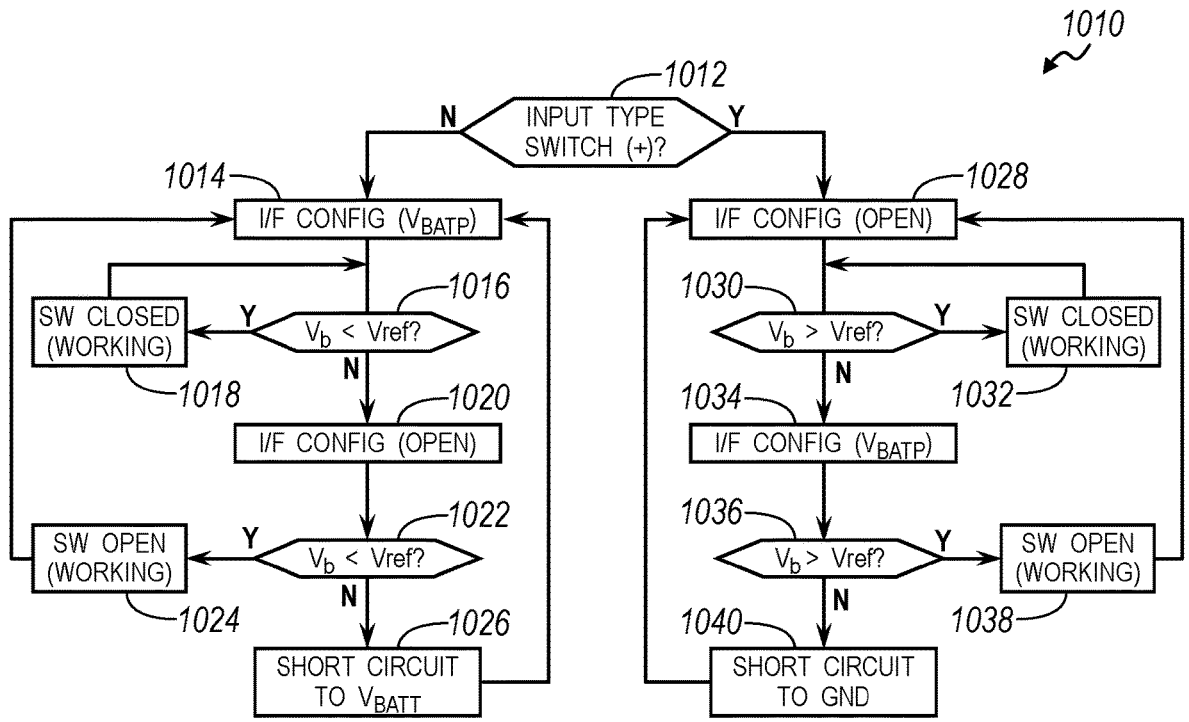
FIG. 10 is a flow chart illustrating a method for evaluating the performance of controller inputs connected to the second interface unit according to one or more embodiments.

With reference to FIG. 10, and referring back to FIGS. 6A-8, a method for evaluating the performance of controller inputs that are connected to the second interface unit 212 is illustrated according to one or more embodiments and generally referenced by numeral 1010. The method 1010 is implemented using software code contained with the microcontroller 124 according to one or more embodiments. In other embodiments, the method 1010 is implemented in other vehicle controllers, or distributed among multiple vehicle controllers.

In operation 1012, the microcontroller 124 evaluates the input pin type to determine if it is switched positive. If not, i.e., the input pin type is switched to ground, then the microcontroller 124 proceeds to operation 1014 and sets the normal operating condition of the interface unit to a pull-up configuration, such as that shown in FIG. 7A. Next at operation 1016 the switch detection circuit 122 evaluates the voltage signal by comparing Vb to a reference voltage (Vref), e.g, using the comparator 260. If Vb is less than Vref (e.g., as shown by Vb at 820 in FIG. 8 between $t_2$ and $t_3$), then the microcontroller 124 proceeds to operation 1018 and determines that the fourth external switch 136 is closed, and the input circuit is working properly (i.e., there is no fault present), and then returns to operation 1016. If the determination at operation 1016 is negative, the microcontroller 124 proceeds to operation 1020.

At operation 1020, the microcontroller 124 sets the second interface unit 212 to its alternate open circuit test configuration (FIG. 7B). Next at operation 1022 the switch detection circuit 122 evaluates the voltage signal by comparing Vb to a reference voltage (Vref), e.g, using the comparator 260. If Vb is less than Vref (e.g., as shown by Vb at 822 in FIG. 8 between $t_1$ and $t_2$), then the microcontroller 124 determines that the fourth external switch 136 is open at operation 1024 and that the input circuit is working properly (i.e., there is no fault present). Then the microcontroller 124 returns to operation 1014.

If the determination at operation 1022 is negative, i.e., Vb is greater than Vref, e.g. as shown by Vb at 830 in FIG. 8 between $t_5$ and $t_6$, the microcontroller 124 determines that the fourth external switch 136 is shorted to $V_{BATT}$ at operation 1026, and provides a switch status signal that indicates the fault. After operation 1026, the microcontroller 124 returns to operation 1014.

If, at operation 1012, the microcontroller 124 determines that the input type is switched to positive, it proceeds to operation 1028. At operation 1028 the microcontroller 124 sets the normal operating condition of the interface unit to an open circuit configuration, such as that shown in FIG. 6A. Next at operation 1030 the switch detection circuit 122 compares the voltage signal Vb to a reference voltage (Vref), e.g, using the comparator 260. If Vb is greater than Vref (e.g., as shown by Vb at 812 in FIG. 8 between $t_2$ and $t_3$), then the microcontroller 124 proceeds to operation 1032 and determines that the third external switch 134 is closed, and the input circuit is working properly (i.e., there is no fault present), and then returns to operation 1030. If the determination at operation 1030 is negative, the microcontroller 124 proceeds to operation 1034.

At operation 1034, the microcontroller 124 sets the interface unit to its alternate test configuration (FIG. 6B) and activates the pull-up current source 256. Next at operation 1036 the switch detection circuit 122 compares the voltage signal Vb to a reference voltage (Vref), e.g, using the comparator 260. If Vb is greater than Vref (e.g., as shown by Vb at 814 in FIG. 8 between $t_1$ and $t_2$), then the microcontroller 124 determines that the third external switch 134 is open at operation 1038 and that the input circuit is working properly (i.e., there is no fault present). Then the microcontroller 124 returns to operation 1028.

If the determination at operation 1036 is negative, i.e., Vb is less than Vref (e.g. as shown by Vb at 826 in FIG. 8 between $t_5$ and $t_6$), the microcontroller 124 determines that the third external switch 134 is shorted to ground at operation 1040; and provides a switch status signal that indicates the fault. After operation 1040, the microcontroller 124 returns to operation 1028.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:
1. A control module comprising:
a housing with an input pin for connecting to an external power source or ground through an external switch;
an interface unit supported by the housing and adapted to:
connect to the input pin in a normal configuration for providing a wetting current to the external switch; and
connect to the input pin in a test configuration; and
wherein the interface unit comprises:
a first current source connected between an internal power source and the input pin, the first current source configured to bias current flow in a first direction relative to the external switch in one of the normal configuration and the test configuration; and
a second current source connected between ground and the input pin, the second current source configured to bias current flow in a second direction relative to the external switch in the other of the normal configuration and the test configuration;
a microcontroller supported by the housing and programed to:
configure the interface unit in the normal configuration in response to input pin characteristics;
measure a normal voltage of the interface unit;
reconfigure the interface unit in the test configuration;
measure a test voltage of the interface unit; and generate output indicative of a short circuit fault of the external switch based on a comparison of both the normal voltage and the test voltage to a reference voltage.

2. The control module of claim 1, wherein the microcontroller is further programed to generate output indicative of the short circuit fault of the external switch to the external power source in response to the normal voltage and the test voltage being greater than the reference voltage.

3. The control module of claim 1, wherein the microcontroller is further programed to generate output indicative of the short circuit fault of the external switch to ground in response to the normal voltage and the test voltage being less than the reference voltage.

4. The control module of claim 1, wherein the microcontroller is further programed to:
configure the interface unit in the normal configuration, by activating the first current source to bias current flow toward the external switch, in response to input pin characteristics indicative of the external switch being switched to ground during normal operating conditions;
deactivate the first current source after a predetermined time;
reconfigure the interface unit in the test configuration, by activating the second current source to bias current flow away from the external switch; and
generate output indicative of the short circuit fault of the external switch to the external power source in response to the normal voltage and the test voltage being greater than the reference voltage.

5. The control module of claim 1, wherein the microcontroller is further programed to:
configure the interface unit in the normal configuration, by activating the second current source to bias current flow away from the external switch, in response to input pin characteristics indicative of the external switch being switched to the external power source during normal operating conditions;
deactivate the second current source after a predetermined time; and
reconfigure the interface unit in the test configuration, by activating the first current source to bias current flow toward the external switch; and
generate output indicative of the short circuit fault of the external switch to ground in response to the normal voltage and the test voltage being less than the reference voltage.

6. The control module of claim 1, wherein the housing further comprises a second input pin for connecting to the external power source or ground through a second external switch;
a resistor connected between ground and the second input pin for providing an open circuit configuration;
a second interface unit supported by the housing and adapted to:
connect to the second input pin in a second normal configuration for providing a second wetting current to the second external switch; and
connect to the second input pin in a second test configuration; and
wherein the second interface unit further comprises:
a third current source connected between a second internal power source and the second input pin, the third current source configured to bias current flow in a third direction relative to the second external switch in one of the second normal configuration and the second test configuration; and
wherein the resistor is configured to bias current flow in a fourth direction relative to the second external switch in the other of the second normal configuration and the second test configuration.

7. The control module of claim 6, wherein the microcontroller is further programed to:
configure the second interface unit in the second normal configuration, by activating the third current source to bias current flow toward the second external switch, in response to input pin characteristics indicative of the second external switch being switched to ground during normal operating conditions;
reconfigure the second interface unit in the second test configuration, by deactivating the third current source; and
generate output indicative of a second short circuit fault of the second external switch to the external power source in response to the normal voltage and the test voltage being greater than the reference voltage.

8. The control module of claim 6, wherein the microcontroller is further programed to:
configure the second interface unit in the second normal configuration by deactivating the third current source in response to input pin characteristics indicative of the second external switch being connected to the external power source during normal operating conditions;
reconfigure the second interface unit in the second test configuration, by activating the third current source to bias current flow toward the second external switch; and
generate output indicative of a second short circuit fault of the second external switch to ground in response to the normal voltage and the test voltage being less than the reference voltage.

9. A vehicle system comprising:
an input pin for connecting to an external power source or ground through an external switch;
an interface unit adapted to connect to the input pin in a test configuration, and in a normal configuration for providing a wetting current to the external switch; and
a microcontroller programed to:
configure the interface unit in the normal configuration in response to input pin characteristics,
measure a normal voltage of the interface unit,
reconfigure the interface unit in the test configuration,
measure a test voltage of the interface unit, and
generate output indicative of a short circuit fault of the external switch based on a comparison of both the normal voltage and the test voltage to a reference voltage.

10. The vehicle system of claim 9, wherein the microcontroller is further programed to generate output indicative of the short circuit fault of the external switch to the external power source in response to the test voltage being greater than the reference voltage.

11. The vehicle system of claim 9, wherein the microcontroller is further programed to generate output indicative of the short circuit fault of the external switch to ground in response to the test voltage being less than the reference voltage.

12. The vehicle system of claim 9, wherein the interface unit further comprises:

a first current source connected between an internal power source and the input pin, the first current source configured to bias current flow in a first direction in the normal configuration; and a second current source connected between ground and the input pin, the second current source configured to bias current flow in a second direction in the test configuration;

wherein the microcontroller is further programed to:
configure the interface unit in the normal configuration, reconfigure the interface unit in the test configuration, and generate output indicative of the short circuit fault of the external switch to the external power source in response to the test voltage being greater than the reference voltage.

13. The vehicle system of claim 9, wherein the interface unit further comprises:

a first current source connected between an internal power source and the input pin, the first current source configured to bias current flow in a first direction in the test configuration; and a second current source connected between ground and the input pin, the second current source configured to bias current flow in a second direction in the normal configuration;

wherein the microcontroller is further programed to:
configure the interface unit in the normal configuration, reconfigure the interface unit in the test configuration, and generate output indicative of the short circuit fault of the external switch to ground in response to the test voltage being less than the reference voltage.

14. The vehicle system of claim 9 further comprising a resistor connected between ground and the input pin, wherein the interface unit further comprises:

a first current source connected between an internal power source and the input pin, the first current source configured to bias current flow in a first direction relative to the external switch in the test configuration; and wherein the resistor is configured to provide an open circuit configuration in the normal configuration;

wherein the microcontroller is further programed to:
configure the interface unit in the normal configuration, reconfigure the interface unit in the test configuration, and generate output indicative of the short circuit fault of the external switch to ground in response to the test voltage being less than the reference voltage.

15. A method of evaluating controller inputs comprising:
providing a control module with an input pin for connecting to an external power source or ground through an external switch, and an interface unit adapted to provide a wetting current to the external switch;

controlling the interface unit to bias current flow through the external switch along a first path in response to information indicative of input pin characteristics during a normal condition;

measuring a normal voltage of the interface unit during the normal condition; and controlling the interface unit to bias current flow through the external switch along a second path during a test condition;

measuring a test voltage of the interface unit during the test condition; and generating output indicative of a short circuit fault based on a comparison of the normal voltage and the test voltage to a reference voltage;

enabling a first current source to bias current flow toward the external switch along the first path in response to information indicative of the external switch being connected to ground during the normal condition; and generating output indicative of the short circuit fault of the external switch to the external power source in response to the test voltage being greater than the reference voltage during the test condition.

16. The method of claim 15, further comprising:
enabling a second current source to bias current flow away from the external switch along the first path in response to information indicative of the external switch being connected to the external power source during the normal condition; and generating output indicative of the short circuit fault of the external switch to ground in response to the test voltage being less than the reference voltage during the test condition.

17. The method of claim 15, further comprising:
enabling a resistor to bias current flow through the external switch along the first path in response to information indicative of the external switch being connected to the external power source during the normal condition; and generating output indicative of the short circuit fault of the external switch to ground in response to the test voltage being less than the reference voltage during the test condition.

18. The vehicle system of claim 9, wherein the interface unit further comprises:

a first current source connected between an internal power source and the input pin, the first current source configured to bias current flow in a first direction in the normal configuration; and a second current source connected between ground and the input pin, the second current source configured to bias current flow in a second direction in the test configuration.

19. The vehicle system of claim 9, wherein the interface unit further comprises:

a first current source connected between an internal power source and the input pin, the first current source configured to bias current flow in a first direction in the test configuration; and a second current source connected between ground and the input pin, the second current source configured to bias current flow in a second direction in the normal configuration.

20. The vehicle system of claim 9 further comprising a resistor connected between ground and the input pin, wherein the interface unit further comprises:

a first current source connected between an internal power source and the input pin, the first current source configured to bias current flow in a first direction relative to the external switch in the test configuration; and wherein the resistor is configured to provide an open circuit configuration in the normal configuration.

* * * * *